(12) United States Patent
Distefano et al.

(10) Patent No.: US 6,359,335 B1
(45) Date of Patent: *Mar. 19, 2002

(54) METHOD OF MANUFACTURING A PLURALITY OF SEMICONDUCTOR PACKAGES AND THE RESULTING SEMICONDUCTOR PACKAGE STRUCTURES

(75) Inventors: Thomas H. Distefano, Monte Sereno; John W. Smith, Palo Alto; Craig Mitchell, Santa Clara, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/711,036

(22) Filed: Nov. 13, 2000

Related U.S. Application Data

(60) Division of application No. 09/067,310, filed on Apr. 28, 1998, now Pat. No. 6,232,152, which is a continuation-in-part of application No. 08/726,697, filed on Oct. 7, 1996, now Pat. No. 5,776,796, which is a continuation-in-part of application No. 08/246,113, filed on May 19, 1994, now Pat. No. 5,663,106, and a continuation-in-part of application No. 08/610,610, filed on Mar. 7, 1996, now Pat. No. 5,834,339.

(51) Int. Cl.[7] .......................... H01L 21/44; H01L 21/48; H01L 21/50
(52) U.S. Cl. .................. 257/707; 257/684; 257/687; 257/706; 438/107
(58) Field of Search .................. 438/107; 257/707, 257/684, 687, 688, 706

(56) References Cited

U.S. PATENT DOCUMENTS

| | | | |
|---|---|---|---|
| 3,390,308 A | 6/1968 | Marley ........................ 317/100 |
| 3,614,832 A | 10/1971 | Chance et al. ................. 29/626 |
| 3,811,183 A | 5/1974 | Celling ........................ 29/588 |
| 3,868,724 A | 2/1975 | Perrino ........................ 357/65 |
| 4,300,153 A | 11/1981 | Hayakawa et al. ........... 357/80 |
| 4,312,116 A | 1/1982 | Moser et al. .................. 29/588 |
| 4,381,602 A | 5/1983 | McIver ........................ 29/840 |
| 4,536,469 A | 8/1985 | Adlerstein .................... 430/314 |
| 4,658,332 A | 4/1987 | Baker et al. ................. 361/398 |
| 4,710,798 A | 12/1987 | Marcantonio ................ 357/80 |
| 4,766,670 A | 8/1988 | Gazdik et al. ................ 29/830 |
| 4,847,146 A | 7/1989 | Yeh et al. .................... 428/332 |
| 4,915,607 A | 4/1990 | Medders et al. ............ 425/116 |
| 4,918,811 A | 4/1990 | Eichelberger et al. ........ 29/840 |
| 4,920,074 A | 4/1990 | Shimizu et al. ............. 437/211 |

(List continued on next page.)

FOREIGN PATENT DOCUMENTS

| | | |
|---|---|---|
| JP | 60-77446 A | 5/1985 |
| JP | 1-278755 A | 11/1989 |
| WO | WO 89/10005 | 10/1989 |

OTHER PUBLICATIONS

Bascom et al., "Air Entrapment in the Use of Structural Adhesive Films," J. Adhesion, 1972, vol. 4, pp. 193–209, © 1972 Gordon and Breach Science Publishers Ltd.

*Primary Examiner*—Kevin M. Picardat
*Assistant Examiner*—D. M. Collins
(74) *Attorney, Agent, or Firm*—Lerner, David, Littenberg Krumholz & Mentlik, LLP

(57) ABSTRACT

A semiconductor chip packaging assembly comprising a frame having a central aperture, a flexible substrate attached to the frame across the central aperture, and a unitary support structure having a plurality of apertures therethrough attached to the substrate within the central aperture of the frame with at least some of the substrate terminals underlying the unitary support structure. A chip is disposed within each aperture and attached to the substrate with the electrical contacts of the chip connected to the substrate terminals. A compliant layer is disposed between the substrate and the unitary support structure and between the substrate and the chip.

10 Claims, 12 Drawing Sheets

U.S. PATENT DOCUMENTS

| | | | |
|---|---|---|---|
| 5,037,779 A | 8/1991 | Whally et al. | 437/211 |
| 5,120,678 A | 6/1992 | Moore et al. | 437/183 |
| 5,148,265 A | 9/1992 | Khandros et al. | 357/80 |
| 5,148,266 A | 9/1992 | Khandros et al. | 357/80 |
| 5,203,076 A | 4/1993 | Banerji et al. | 29/840 |
| 5,249,101 A | 9/1993 | Frey et al. | 361/717 |
| 5,252,784 A | 10/1993 | Asai et al. | 174/267 |
| 5,258,330 A | 11/1993 | Khandros et al. | 437/209 |
| 5,289,346 A | 2/1994 | Carey et al. | 361/777 |
| 5,304,512 A | 4/1994 | Arai et al. | 437/211 |
| 5,336,931 A | 8/1994 | Juskey et al. | 257/787 |
| 5,385,869 A | 1/1995 | Liu et al. | 437/209 |
| 5,455,390 A | 10/1995 | DiStefano et al. | 174/262 |
| 5,477,611 A | 12/1995 | Sweis et al. | 29/840 |
| 5,483,106 A | 1/1996 | Echigo et al. | 257/783 |
| 5,489,749 A | 2/1996 | DiStefano et al. | 174/261 |
| 5,518,964 A | 5/1996 | DiStefano et al. | 437/209 |
| 5,536,909 A | 7/1996 | DiStefano et al. | 174/261 |
| 5,563,445 A | 10/1996 | Iijima et al. | 257/698 |
| 5,659,952 A | 8/1997 | Kovac et al. | 29/840 |
| 5,663,106 A | 9/1997 | Karavakis et al. | 29/841 |
| 5,679,977 A | 10/1997 | Khandros et al. | 257/692 |
| 5,688,716 A | 11/1997 | DiStefano et al. | 437/182 |
| 5,704,174 A | 1/1998 | DiStefano et al. | 361/749 |
| 5,720,100 A | 2/1998 | Skipor et al. | 29/840 |
| 5,776,796 A | 7/1998 | DiStefano et al. | 438/106 |
| 5,834,339 A | 10/1998 | DiStefano et al. | 438/125 |
| 5,929,517 A * | 7/1999 | Distefano et al. | |

* cited by examiner

METHOD OF MANUFACTURING A PLURALITY OF SEMICONDUCTOR PACKAGES AND THE RESULTING SEMICONDUCTOR PACKAGE STRUCTURES

CROSS REFERENCE TO RELATED APPLICATIONS

This application is a divisional of commonly assigned U.S. patent application Ser. No. 09/067,310 filed Apr. 28, 1998, now U.S. Pat. No. 6,232,152, which is a continuation-in-part of commonly assigned U.S. Patent Application Ser. No. 08/726,697 filed Oct. 7, 1996, now U.S. Pat. No. 5,776,796, which is a continuation-in-part of commonly assigned U.S. patent application Ser. No. 08/246,113 filed May 19, 1994, now U.S. Pat. No. 5,663,106 and commonly assigned U.S. patent application Ser. No. 08/610,610 filed Mar. 7, 1996, now U.S. Pat. No. 5,834,339, the disclosures of both said applications being incorporated by reference herein.

The present application further claims benefit of U.S. Provisional Application No. 60/073,843, which is filed on Feb. 5, 1998.

FIELD OF THE INVENTION

The present invention relates generally to a method of encapsulating a semiconductor package assembly or an array of such semiconductor package assemblies typically arranged on a supporting panel, while protecting the package's exposed terminals.

BACKGROUND OF THE INVENTION

In the construction of semiconductor chip package assemblies, it has been found desirable to interpose encapsulating material between and/or around elements of the semiconductor packages in an effort to reduce and/or redistribute the strain and stress on the connectors between the semiconductor chip and a supporting circuitized substrate during operation of the chip, and to seal the elements against corrosion, as well as to insure intimate contact between the encapsulant, the semiconductor die and the other elements of the chip package.

It is often desirable to package a semiconductor chip assembly such that it can be handled with less fear of damage to the assembly so that a heat sink can be married with the semiconductor chip. However, if a semiconductor chip assembly is to be so packaged, the utmost care must be taken during the packaging process to avoid affecting the integrity of the terminals on the chip carrier. In particular, it is important to avoid contaminating the terminals on the chip carrier with the encapsulant.

Certain designs have reduced solder connection fatigue by redistributing the thermal cycling stress into a portion of the chip package itself. An example of such a design is shown in U.S. Pat. Nos. 5,148,265 and 5,148,266, the both disclosures of which are incorporated herein by reference. One disclosed embodiment of these patents shows the use of a chip carrier in combination with a compliant layer to reduce the coefficient of thermal expansion ("CTE") mismatch problems. Typically, the compliant layer includes an elastomeric layer which, in the finished package, it disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

In some arrangements used heretofore, the compliant layer is formed by stenciling a thermoset resin onto the chip carrier and then curing the resin. Next, additional resin is applied to the exposed surface of the cured layer, this additional resin is partially cured, and the resulting tacky adhesive surface was used to bond the elastomeric layer to the chip and the chip carrier. Once attached, the entire structure is heated and fully cured. The leads are then bonded to respective chip contacts. An encapsulant material is then disposed under and around the leads from the terminal side of the assembly. This process amounts to very carefully depositing a controlled amount of encapsulant on the periphery of the contact surface of the chip from the terminal side of the assembly, building layer upon layer of encapsulant until the leads are fully encapsulated. In such a process, the encapsulant is held in place by the surface tension of the encapsulant material between the dielectric layer and the contact bearing surface of the chip. Using such a method, the encapsulant material may creep on to the exposed surface of the dielectric layer potentially contaminating the terminals and also overcoming the surface tension of the encapsulant further causing the encapsulant to get onto other surfaces of the assembly or onto adjacent chip assemblies.

Accordingly, a method of controlling the encapsulation of a semiconductor chip package assembly such that the integrity of the terminals and leads are not affected is desirable.

SUMMARY OF THE INVENTION

The present invention provides a method of encapsulating a semiconductor device and associated package structures.

The method according to the present invention includes a method of packaging a plurality of semiconductor chips in which a compliant spacer layer is disposed between a top surface of a sheet-like substrate and surface of each semiconductor chip, wherein the semiconductor chip has contacts a surface thereof and wherein the substrate has terminals at least some of which lie outside the periphery of the chip. The substrate terminals and the chip contacts are then electrically connected to one another by flexible, electrically conductive lead. A unitary support structure is then aligned with the chips and attached to or abutted against the compliant layer around the periphery of the chips. A curable liquid encapsulant is then deposited around at least a portion of the periphery of each chip on top the unitary support structure so as to encapsulate the leads and at least one surface of the chip. Alternately, the curable liquid encapsulant may deposited around at least a portion of the periphery of each chip so as to encapsulate the leads and at least one surface of the chip and the unitary support structure may then aligned with the chips and attached to (and/or embedded in) the encapsulant around the periphery of the chips. The unitary support structure may be conductive (electrically or thermally) or insulative and further may have apertures or slots therein for reducing voids or bubbles between the unitary support structure and the encapsulant during the attached step. Optionally, a additional step of applying uniform pressure to the chip assemblies prior to the curing step may be employed such that such pressure reduces voids or bubbles between the unitary support structure and the encapsulant. The encapsulant is then cured to define an integrated composite of chip packages which may be singulated into individual chip packages or into multi-chip modules. Typically, the substrate is held taut of a frame during the packaging process.

The structures according to the present invention include a multi-chip frame assembly comprising a frame having a central aperture and a flexible substrate having electrical leads and terminals, said substrate being attached to the frame across the aperture. A plurality of chips, each having a plurality of chip contacts, are attached to the substrate such that at least some of the substrate terminals are lying outside the periphery of the chips. The chip contacts are electrically connected to respective substrate terminals. A unitary support structure having a plurality of apertures therethrough is attached to the substrate within the central aperture of the frame such that at least some of the substrate terminals underlying the unitary support structure. A compliant layer is disposed between the chip and the substrate and the unitary support structure and the substrate. The assembly of parts thereby defining an integrated composite of chip packages.

In one preferred embodiment of the present invention, the compliant spacer layer is comprised of a plurality of compliant pads which are disposed between the substrate and the chips. Such compliant pads may also be disposed around the periphery of the chips for engagement with the unitary support structure so as to facilitate planarizing the unitary support structure along the length and width of the assembly.

The unitary support structure may be a sheet-like ring element having a plurality of apertures therethrough such that the aligning step registers each aperture with a respective chip such that each chip is at least partially received within a respect aperture. In one embodiment, a sheet like thermal spreader may be attached to the exposed major surface of such a ring element type unitary support structure to create a fully enclosed unit around each chip. In another embodiment, such a ring element type unitary support structure and the frame may be integral with one another such that they can be manufactured in a single process, such as etching or stamping. In still a further embodiment, the unitary support structure may be comprised of a plurality of substantially, integral continuous cap structures having a plurality of cavities, such that the cap structures are aligned with the chips so that each of the cavities at least partially receives a respective chip therein. Such a cap type unitary support structure would preferably be thermally conductive. Also, such a cap type unitary support structure preferably has grooves in a exposed surface to facilitate the singulation of the chip packages from one another. Also, there may be more than one unitary support structure which are aligned with the chips and attached to the encapsulant.

In a further variant of the present invention, the chips may be oriented such that the chip contacts face away from the substrate. In such an embodiment, if a cap type unitary support structure is employed, it may have a similar coefficient of thermal expansion to that of semiconductor chips so as to constrain the leads and encapsulant between the unitary support structure and each of the chips.

The foregoing and other objects and advantages of the present invention will be better understood from the following Detailed Description of a Preferred Embodiment, taken together with the attached Figures.

DETAILED DESCRIPTION OF A PREFERRED EMBODIMENT

Figure 1:
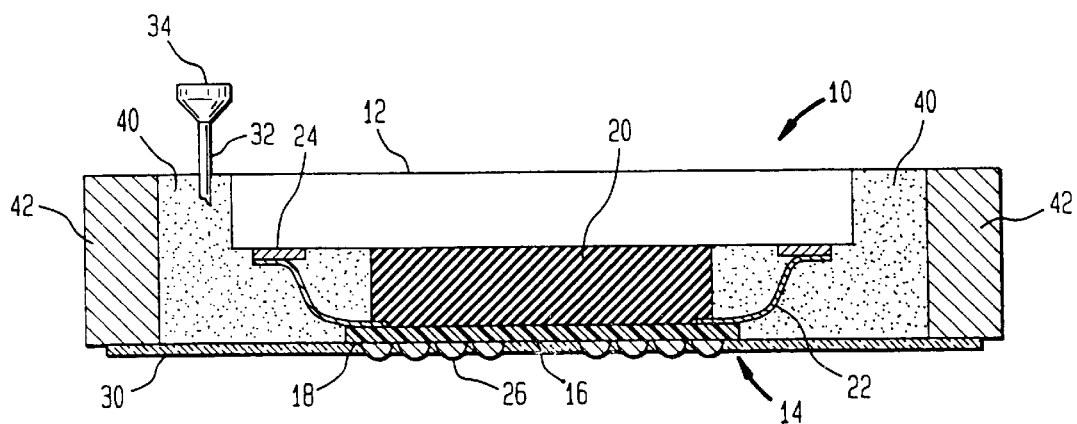
FIG. 1 is a side cross-sectional view, illustrating a semiconductor chip package assembly being encapsulated in an inverted position within a frame, according to the present invention.

Referring to FIG. 1, a semiconductor chip package assembly, generally designed as 10, includes a semiconductor chip 12 and a chip carrier 14. The chip carrier 14 is made up of a dielectric layer 16 (which may be flexible or rigid and is preferably made from a thin sheet of material such as polymide) and a spacer layer 20 (typically compliant or elastomeric, referred to herein as a "compliant layer") disposed between the dielectric layer 16 and the semiconductor chip 12. The semiconductor chip 12 and the chip carrier 14 are electrically connected through a plurality of leads 22 which are connected to the chip 12 through chip contacts 24. The leads 22 are further electrically connected to terminals 26 on the top surface 18 of the chip carrier 14. The terminals 26 connect the semiconductor chip assembly 10 to a printed wiring board ("PWB") or other substrate (not shown), thus the terminals 26 should remain uncontaminated throughout testing and final assembly so as to ensure a good electrical connection with the PWB.

FIG. 1 further shows the semiconductor chip package assembly 10 positioned within a ring, frame or panel 42 (generally referred to herein as a "frame"). Typically, frame 42 is comprised of a substantially planar sheet of material having an aperture within which the semiconductor chip package assembly 10 is placed such that there is a gap between each edge of the chip assembly and each respective side wall of the frame 42, as shown.

Figure 2:
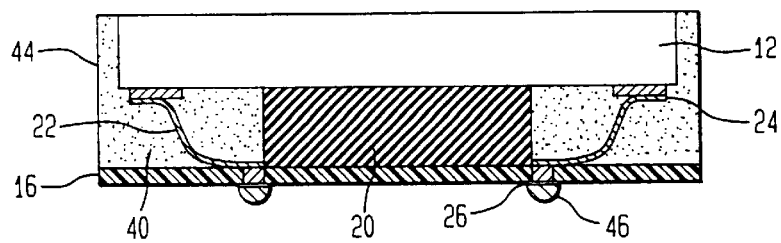
FIG. 2 is a side cross-sectional view of a singulated device having bumpers around the periphery of the chip package assembly, according to the present invention.

A solder mask or coverlay 30 (referred to generically herein as "coverlay") is attached to the frame 42, and stretched taut across the aperture in the frame 42 to better ensure the dimensional stability of the substrate. The coverlay 30 is further attached to top surface 18 of the dielectric layer 16 so that it holds the chip assembly 10 in position within the frame 42. The coverlay 30 is preferably made of a photo-sensitive dielectric polymer material such as Dupont Pyralux PC 1025. The coverlay 30 is further typically adhesively attached to both the frame 42 and the dielectric layer 16, such as by using a vacuum lamination technique well known to those skilled in the art, so that the terminals 26 are protected from the encapsulant material 40 which is subsequently deposited, as described below. This can be accomplished by vacuum laminating the coverlay 30 over the terminals 26 or by providing apertures in the coverlay 30 which are aligned with the terminals 26 so that the terminals may be disposed therein (as shown in FIG. 1). Preferably, the terminals 26 are not rounded bumps (as shown) but are substantially flat pads on the surface of the dielectric layer 16, and may just be an extension and broadening out of leads 22. In such a flat terminal embodiment (such as shown in FIGS. 2 and 4), a photosensitive coverlay 30 may be adhered to the top surface 18 of the dielectric layer 16 so that the portions of the coverlay 30 overlying the terminals may be removed using photolithographic techniques at a later time. The coverlay may be attached to the frame 42 prior to attachment of the dielectric layer 16 of the chip assembly 10 or the chip assembly 10 may be attached to the coverlay 30 layer prior to the attachment of the coverlay layer 30 to the frame 42.

Once the semiconductor chip assembly 10 has been positioned and attached to the coverlay and ring, encapsulation material 40 is introduced into the open area between the frame 42 and the periphery of the semiconductor chip assembly 10. The encapsulation material 40 is comprised of a curable liquid which will allow the leads 22 to "flex" after the encapsulant 40 has been cured in response to thermal cycling forces during operation of the finished package. In the preferred embodiment, the encapsulant is comprised of an electronic grade silicone-based or epoxy-based resin; although, other materials may be used. The curing mechanism of the encapsulation material 40 will depend on the particular encapsulant material used so that the encapsulant can be cured or partially cured. Typical curing mechanisms are radiant energy, thermal energy, moisture or ultraviolet light.

The introduction of encapsulant 40 may take place by using a needle-like dispenser 32 connected to an encapsulant source 34 (such as a CAM/ALOT programmable dispensing machine manufactured by Camelot Systems, Inc. in Haverhill, Mass.); although, this step could also be accomplished using other processes. Typically, the dispenser 32 is moved around the periphery of the chip 12 until the desired level of encapsulant 40 has been substantially uniformly dispensed therearound; although, the dispensing operation need not be exact because the terminals 26 are protected from contamination by the coverlay 30 (covering the chip carrier 14) and the frame 42 (bounding the encapsulant 40 on the sides). In the embodiment shown in FIG. 1, the encapsulant is dispensed such that the level of the encapsulant 40 is just below the plane of the back surface of the chip 12. If the frame 42 is not removed from the finished package, dispensing the encapsulant 40 to the level of the back surface of the chip 12 and then curing the encapsulant allows the finished package to have more structural integrity.

The semiconductor chip package assembly and frame/encapsulant surrounding structure may then be attached to a PWB using a suitable conductive bonding material, such as eutectic solder. Alternately, a dicing means (such as a dicing saw, water jet, ultrasonic knife, rotary razor, laser, etc.) may be employed to separate the encapsulated chip assembly structure from the frame 42 so that the resultant chip package is no wider or only slightly wider than the periphery of the chip 12 itself. This allows for the operation of having a protective "bumper" 44 of cured encapsulant material around the periphery of the semiconductor chip assembly as shown in FIG. 2. In such an embodiment, the dielectric layer 16 is juxtaposed with the contact bearing surface of the chip 12, as before; however, the dielectric layer 16 in the diced package embodiment shown in FIG. 2 is larger than the contact bearing surface of the chip 12 such that it extends beyond the perimeter of the chip 12. The encapsulant 40 correspondingly extends beyond the chip perimeter to form a bumper 44 of encapsulant material. The bumper 44 further protects the edges of the chip and the metallurgy of the joint between the leads 22 and the contacts 24. The bumper also provides added durability to the package by protecting the sides of the chip 12.

Most preferably, the encapsulant 40 is deposited such that it does not flow onto the back surface (non-contact bearing surface) of the chip 12. This allows the back surface of the chip to subsequently be connected to a heat sink or thermal spreader without an insulative material impeding the dissipation of heat from the chip 12 during thermal cycling. In some embodiments, the back surface of the chip 12 may be protected with a removable membrane, film or other layer to substantially reduce or eliminate the possibility of such contamination, as described in more detail in the embodiments discussed below.

Figure 3A:
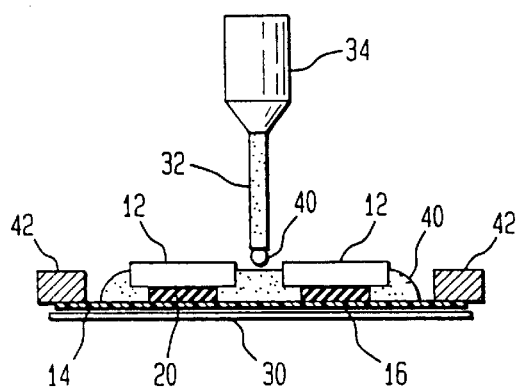
FIGS. 3A and 3B show various views of the encapsulation technique shown in FIG. 1 used with a plurality of devices on a common frame, according to the present invention.
Figure 3B:
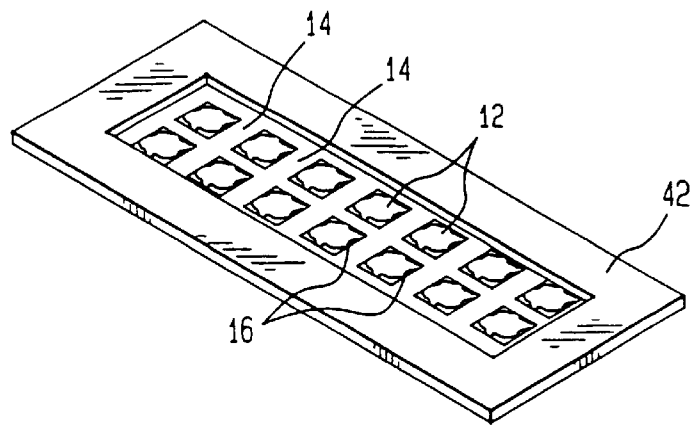

In an alternate embodiment shown in FIGS. 3A and 3B, the encapsulant can be dispensed so that it just covers the cavity between the leads 22, the compliant layer 20 and the dielectric layer 16 such that the cured encapsulant either is deposited to approximately the level of the contact bearing surface of the chip 12 or just protrudes slightly from the cavity between the chip 12 and the coverlay 30. In such an embodiment, the encapsulated chip assembly is typically diced so that the finished package is no larger than the periphery of the chip 12 itself, as shown in FIGS. 4A and 4B.

The embodiment shown in FIGS. 3A and 3B show that the encapsulation of the semiconductor chip assemblies 10 can be performed on a plurality of package assemblies 10 simultaneously, i.e. where the aperture in the frame 42 is large enough to accept many semiconductor chip assemblies 10 on the same coverlay 30. In this embodiment, it is preferable to have each chip 12 connected to the same chip carrier 14/coverlay 30 combination, as shown in FIG. 3A. Added manufacturing efficiency can be reached by encapsulating a plurality of such packages within the same frame by dispensing encapsulant in a first direction between and along the adjacent packages from one side of the frame 42 to the next before having to dispense in an orthogonal direction between and along such packages. The encapsulated chip assemblies may then be cut away of "diced" into individual chip packages or into interconnected multi-chip packages. The encapsulation of many chips 12 simultaneously is preferred to facilitate the mass production of finished packages. As described above, the encapsulant 40 is deposited from the chip side of the coverlay 30 and the coverlay ensures that the encapsulant 40 is bounded when it is deposited in liquid form such that it does not escape through possible bonding apertures 50 (FIG. 4B) and contaminate the terminals 26 and thus impede any subsequent electrical connection of the terminals to bond pads on a PWB. The frame 42 also acts as a barrier to provide a side boundary for the deposited encapsulant 40 should the need arise.

After the encapsulant has been deposited, the frame 42 can be placed within a temperature/pressure chamber so as to remove any possible voids or gas bubbles in the encapsulant and to cure the encapsulant 40, as described in U.S. patent application Ser. No. 610,610.

Figure 4A:
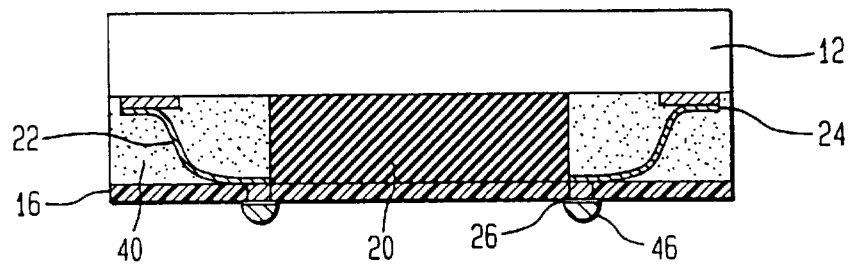
FIG. 4A is a side cross-sectional view of a singulated chip package assembly, according to the present invention.
Figure 4B:
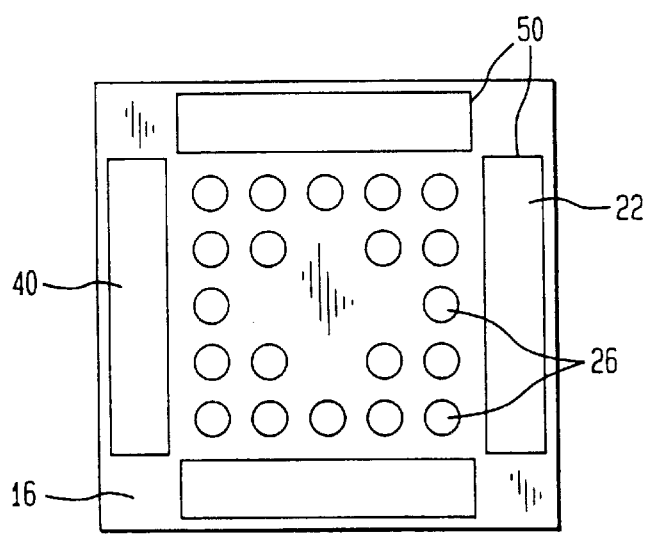
FIG. 4B is a face view of the chip package assembly shown in FIG. 4A, according to the present invention.

As described above, after the encapsulant 40 has been cured, the semiconductor chip packages within the frame 42 are next separated (or "diced") from the chip carrier 14 into single packaged chips, such as that shown in FIGS. 2 and 4A, or the packaged chip may be diced into multi-chip modules.

The finished package shown in FIG. 2 has some benefits compared with the package shown in FIG. 4A. First, in FIG. 2, the dielectric layer 16 is extended to be the same size as the contact bearing surface of the chip 12. This allows the cured encapsulant layer 40 to have a substantially uniform thickness at every point between the chip 12 and the dielectric layer 16, even at the periphery of the package. This provides added support for the leads 260 during thermal cycling of the component as well as physical and environmental protection for the metallurgy of the connection between the leads 260 and the contacts 270. Further, as described above, the embodiment shown in FIG. 2 has a bumper 44 of encapsulant 40 for added physical and environmental protection.

Figure 5:
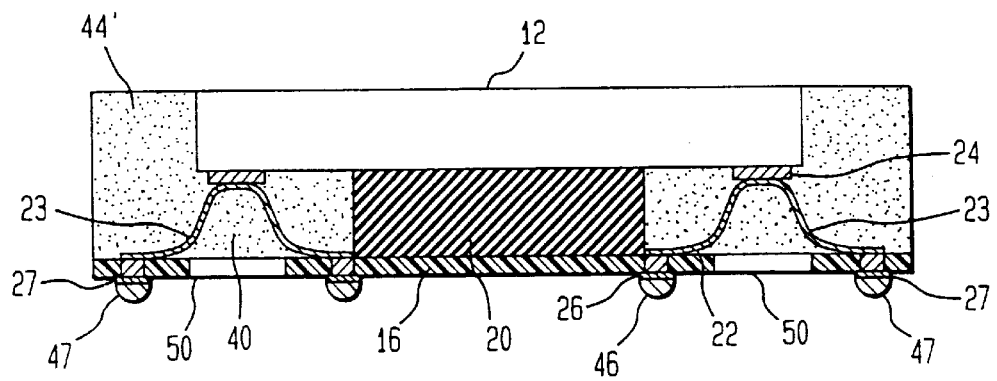
FIG. 5 is a side cross-sectional view of a singulated device having bumpers around the periphery of the chip package assembly and further having terminals beyond the periphery of the periphery of the chip, according to the present invention.

FIG. 5 shows a still further package embodiment which is diced such that it has extended bumpers 44' which support at least one outer row of terminals 27 which lie outside the periphery of the contact-bearing surface of the chip 12. The terminals 27 are electrically connected through leads 23 which are bonded down through the bonding apertures 50. A rigid back plate, typically made of a thermally conductive material, may be attached to the back surface of the chip and bumpers to add support to the outer row of terminals. Alternately, a rigid ring may be attached solely to the back surface and/or side surfaces of the bumpers thereby providing support to the outer row of terminals and further providing a direct thermal path to the back of the chip.

Figure 6A:
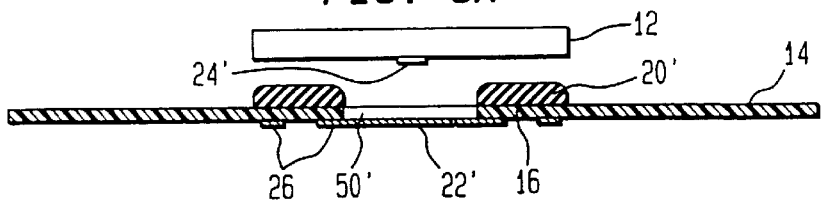
FIGS. 6A–6G show the process steps for encapsulating a center bonded semiconductor chip package assembly, according to the present invention.
Figure 6B:
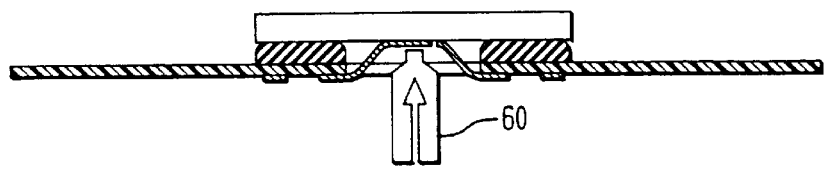
Figure 6C:
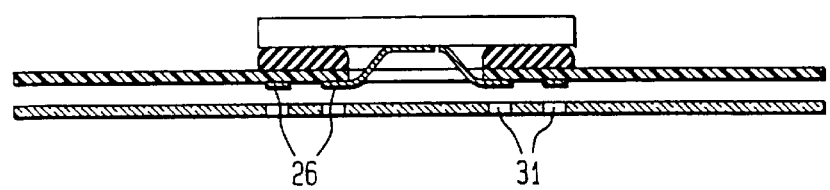
Figure 6D:
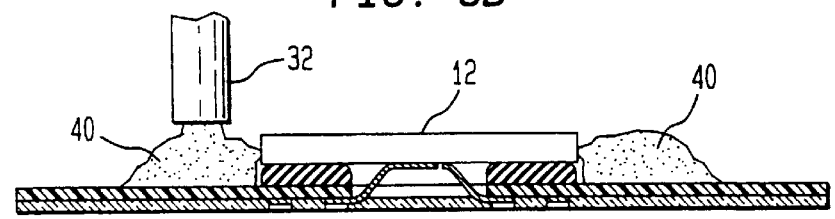
Figure 6E:
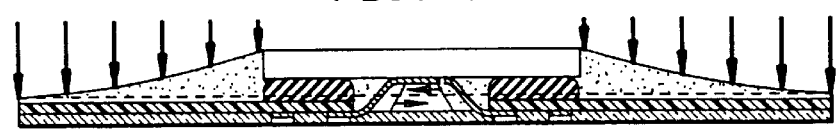
Figure 6F:
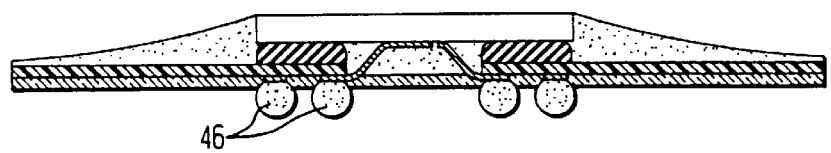
Figure 6G:
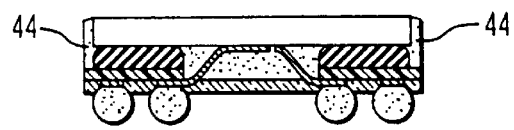

FIGS. 6A–G show the process steps for encapsulating a semiconductor chip package, such as described above, for a chip package embodiment which has chip contacts 24' that are located in the center of the face surface of the chip 12. In this embodiment, the compliant layer consists of two separate compliant pads 20' attached to the dielectric layer 16 and positioned on either side of the row of chip contacts 24'. Likewise, the leads 22' extend into the centrally located bonding aperture 50' and are aligned such that they may be bonded to respective chip contacts 24' using a bonding tool 60 and an appropriate energy source (such as ultrasonic, thermocompression or thermosonic energy), as shown in FIG. 6B. The leads 22' are bonded to the contacts 24' in somewhat of an interleaving pattern. As shown in FIG. 6C and described in more detail above, The coverlay 30 attached to the chip carrier 14 typically using a vacuum lamination technique. Apertures 31 in the coverlay 30 allow electrical connection with the terminals 26. In FIG. 6D, the dispenser 32 deposits a liquid encapsulant 40 around the periphery of the chip 12. The amount or volume of the deposited encapsulant need not be tightly regulated; however, preferably, the encapsulant 40 does not get on to the exposed back surface of the chip 12, so that the chip 12 may dissipate heat more easily when the packaged semiconductor chip is in operation, as described above. In FIGS. 6E–6F, uniform pressure is applied to the outside of the assembly to create a uniform, substantially void/bubble free encapsulant layer by collapsing the voids/bubbles therein, as described in more detail in U.S. patent application Ser. No. 610,610 filed Mar. 7, 1996. FIG. 6G shows the packaged chip after it has been diced away from the rest of the encapsulant 40/coverlay 14. This package has been diced to create the protective bumpers 44, shown in FIG. 2; however, it could be diced such that no bumper 44 exists.

Figure 7A:
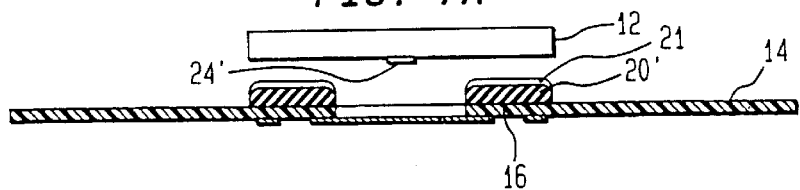
FIGS. 7A–7G show the process steps for encapsulating a center bonded semiconductor chip package assembly as shown in FIGS. 6A–6G with a flexible membrane attached thereto, according to the present invention.
Figure 7B:
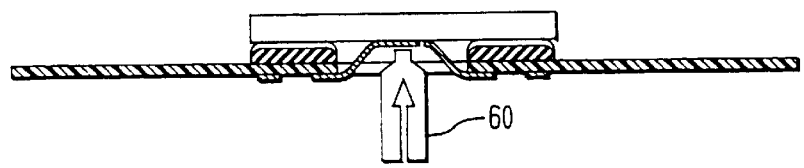
Figure 7C:
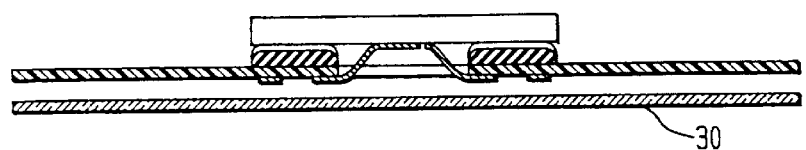
Figure 7D:
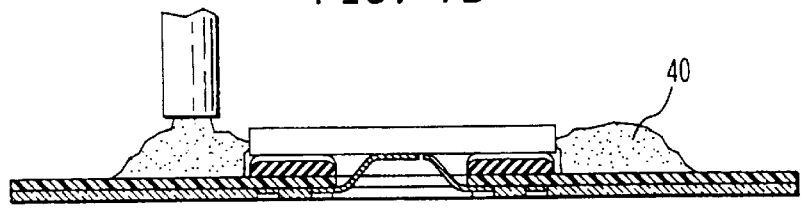
Figure 7E:
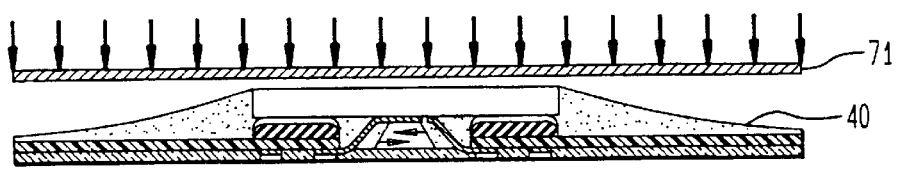
Figure 7F:
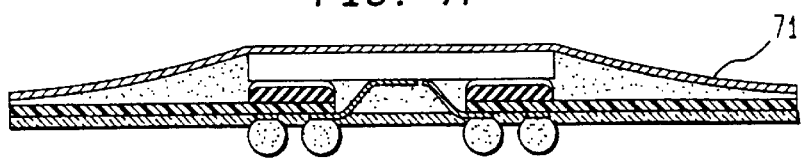
Figure 7G:
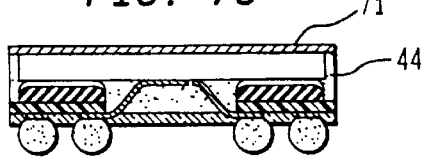
Figure 9A:
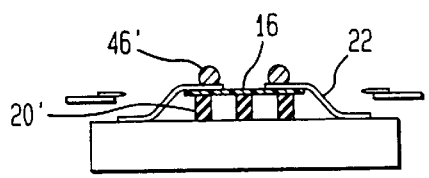
FIGS. 9A–9D show the process steps for encapsulating a semiconductor chip package assembly in which the chip carrier is encapsulated leaving only the raised terminals to protrude from the face surface of the chip package, according to the present invention.
Figure 9B:
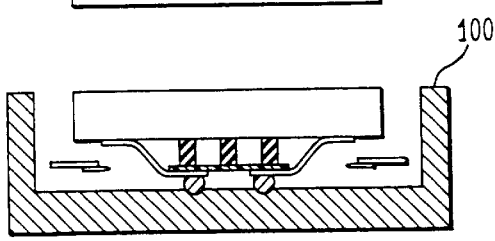
Figure 9C:
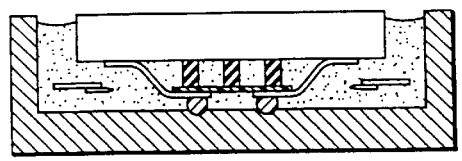
Figure 9D:
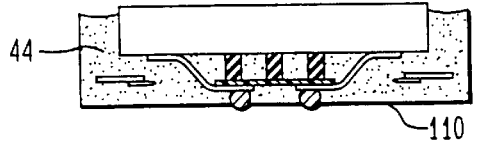
Figure 10A:
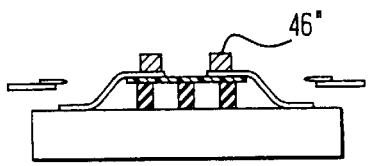
FIGS. 10A–10D show a process similar to that shown in FIGS. 9A–9D except that the raised terminals are removed after the encapsulation/cure steps, according to the present invention.
Figure 10B:
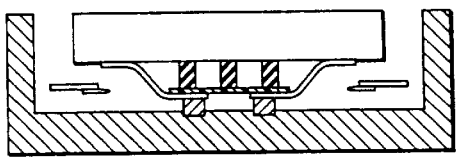
Figure 10C:
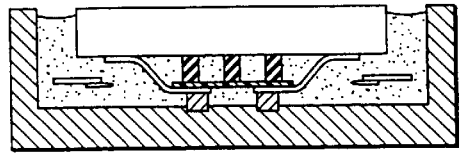
Figure 10D:
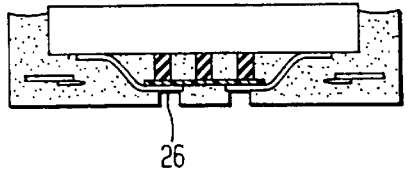

FIGS. 7A–7G show a variation in the process shown in FIGS. 6A–6G where a membrane 71 may be applied or deposited in a sheet form atop the assembly, as shown in FIGS. 7F and 7G. The membrane is flexible and is biased such that it comes into intimate contact with the back surface of the chip 12, and preferably is laminated or otherwise attached thereto. The portions of the membrane 71 beyond the periphery of the chip 12 may be used to mechanically force the encapsulant around the leads 22' and beneath the chip 12 (if required). The membrane 71 also helps to ensure that encapsulant 40 does not get onto the back surface of the chip 12, as described above. After the encapsulant is cured, the membrane 71 is typically sealed to the back of the chip 12 and cured encapsulant. After the assembly has been diced, the membrane protects the back surface of the chip 12 and further binds the bumper portions 44 so that they do not de-laminate from the side edges of the chip 12, as shown in FIG. 7G. The membrane 71 may be comprised of thermally conductive material (such as a heat bondable thermal conductor) such that a cooling surface of heat sink may be attached thereto. Alternately, the membrane 71 may be removed from the back of the die leaving the back surface of the chip 12 bare to be subsequently attached to a cooling surface or heat sink.

Figure 8:
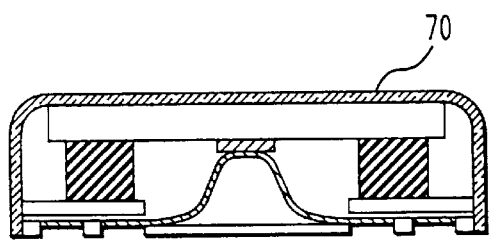
FIG. 8 is a side cross-sectional view of a singulated device having bumpers around the periphery of the chip package assembly and further having a protective membrane attached to the exposed surfaces of the chip and bumpers, according to the present invention.

In a variation such as is shown in FIG. 8, a membrane 70 is applied in a sheet form around the exposed surfaces of the chip 12 and bumpers 44 after the dicing step typically using a vacuum lamination technique, in effect, laminating the membrane 70 to the back surface of the chip and exposed surface of the bumpers 44. Such a membrane 70 may be permanently sealed to the back of the chip protecting the chip and further binding the bumper portions so that they do not de-laminate from the side edges of the chip. This may be used in conjunction with other package variations, such as shown in FIG. 5. Alternately, the membrane 70 could just be attached to the exposed back of the chip and the tops of the bumper portions without wrapping around the exposed sides of the bumpers.

FIGS. 9A–9D show an overmolded encapsulation technique similar to that described above except that the encapsulant 40' completely encompasses the dielectric layer 16' thereby allowing only the raised terminals 46' to be exposed. Using this technique, chip 12 is assembled to the chip carrier 14, as described above. In these figures, the compliant layer has been replaced by a plurality of compliant pads 20' which provide a stand off or gap between the substrate 16, and the contact bearing face surface of the a semiconductor chip 12, further described in U.S. patent application Ser. Nos. 365, 699 and 610,610 both commonly assigned and hereby incorporated by reference. Raised terminals 46' lie above the terminal pads 26'. This assembly is then placed terminals first into a mold. The raised terminals provide a stand-off between the substrate and the mold 100. Encapsulant 40 is then introduced into the mold such that at least a portion of the raised terminals 46' are protected from the encapsulant 40. This can be accomplished any number of ways, such as providing recessed areas in the mold for receiving the raised terminals. The construction of the mold 100 is not critical so long as it does not impede the flow of the encapsulant 40. After the encapsulant has been deposited such that it encapsulates the entire package (or packages if a plurality of packages are being simultaneously encapsulated) including the front surface of the dielectric layer 16, the encapsulant is cured and the mold 100 is removed. The removal of the mold can be accomplished by dissolving the mold or making the mold that the encapsulant 40 does not wet to its surface. This produces a package which has a front face 110 completely comprised of the cured encapsulant material except for the raised materials. The packages are then separated or diced from the frame 42 or each other as needed.

FIGS. 10A–10D show a process for encapsulating which is substantially similar to that shown in FIGS. 9A–9D except that sacrificial raised terminals 46" are used. After the package has been encapsulated in the mold, the mold 100 is removed. The sacrificial terminals are then also removed, typically by a dissolving or etching process. Solderballs or other connection means can then be directly attached to the terminals 26. The parts are then separated from the frame 42 as needed.

Figure 11:
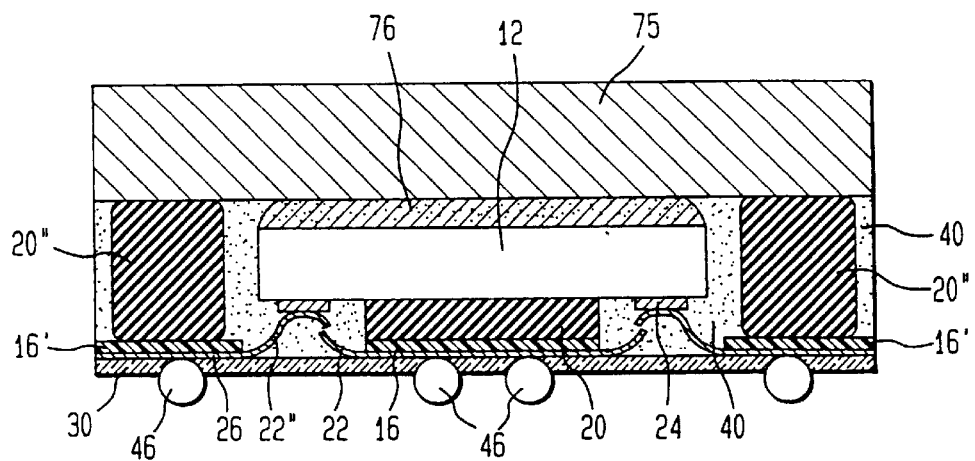
FIG. 11 shows a cross-sectional side view of a so called fan-in/fan-out embodiment of the present invention.

FIG. 11 shows a cross-sectional side view of a so called fan-in/fan-out embodiment of the present invention. As shown, a fan-in/fan-out package has terminals 26 which both overly the chip surface and are also positioned beyond the periphery of the chip 12 on the dielectric substrate layer 16/16'. Here, the chip 12 is attached to a rigid, thermally conductive plate 75, typically using conventional thermally conductive die attach adhesive 76, such as a silver filled epoxy or the like. The dielectric layer 16 overlies both the face surface of the chip 12 and a surface of the rigid plate 75 and is adhered to each such surface with a compliant layer 20/20". As described above, compliant layer 20 may be comprised of a single layer/pad or a plurality of pads/posts and compliantly supports the dielectric layer 16. Compliant layer 20" also compliantly supports the outer dielectric layer 16' and is preferably comprised of a plurality of pads/posts 20" which are positioned around the outer periphery of the chip 12 such that the outer dielectric layer 16' is somewhat uniformly supported. The conductive leads 22/22" are then bonded through the bonding apertures 50 to respective chip contacts 24 typically using an interstitial lead design, where adjacent leads are connected to opposite dielectric layers 16/16'. The leads interconnect respective terminals 26 and the chip contacts 24. After the leads are bonded, the coverlay 30 is placed over the exposed surface of the dielectric layers 16/16' such that the bonding apertures 50 are sealed. Encapsulant 40 is then deposited around at least a portion of the periphery of the assembly. The encapsulant flows into and between the pads 20" so as to create a substantially void/bubble free encapsulant layer between and around the other package elements. The encapsulant is then cured and the package is diced. The embodiment shown in FIG. 11 can be produced one at a time. Preferably, however, it is produced using a panel process, as described above, such that many chips 12 can be packaged simultaneously. In such a plural embodiment, the bumpers 44, described above, could also be disposed around the outside periphery of the package such that the peripheral edges of the rigid plate 76 in the resulting package are covered by cured encapsulant. Obviously, the embodiment shown in FIG. 11 could also be used to produce a fan-out only (no terminals overlying the chip) chip package.

Figure 12A:
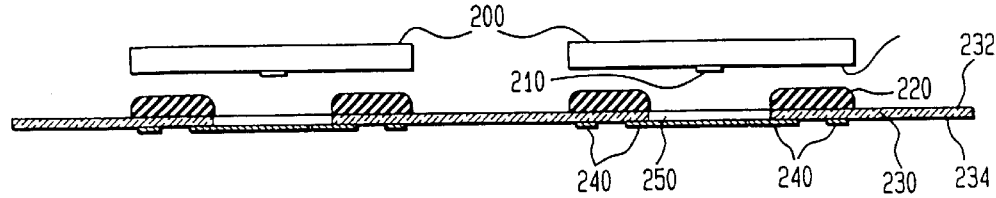
FIGS. 12A–12G show the process steps for manufacturing a center bonded semiconductor chip package assembly and the resulting package structure, according to the present invention.
Figure 12B:
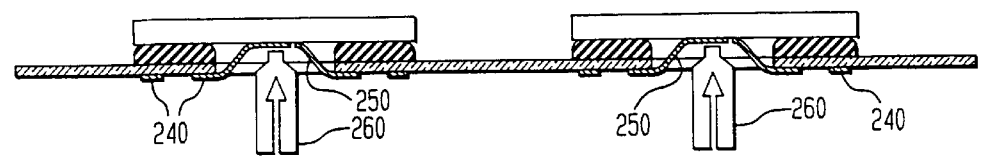

FIGS. 12A through 12G show process steps for simultaneously manufacturing a plurality of semiconductor chips having a ring-like support structure as discussed in reference to FIG. 5, above. In this embodiment, the chips 200 have chip contacts 210 that are located in a center region of the face surface 205 of the chip 200, similar to the embodiment shown in FIGS. 6A–6G. Multiple chips 200 are attached to a single substrate 230 through the use of compliant layers 220. The compliant layers consist of multiple compliant stand-offs or pads which are disposed on either side of the chip contacts 210. Preferably, the substrate 230 is made of a flexible, sheet-like substrate, such as polymide, and is attached at its edges to a frame and held somewhat taut by the frame, such as is shown in FIGS. 1, 3A and 3B. The substrate 230 has a first surface 232 facing towards the chips 200 and a second surface 234 facing away from the chips 200. There are electrically conductive terminals 240 and leads 250 on the substrate. However, there may also be other structures such as ground and power planes on one of more of the substrate surfaces. Typically, the leads 250 are aligned with respective chip contacts 210 by spanning across one or more bonding windows which allow the leads 250 to be bonded to the contacts 210 using a conventional bonding tool and an appropriate energy source (such as ultrasonic, thermocompression or thermosonic energy), as shown in FIG. 12B. The leads 250 shown in FIG. 12B are bonded to the contacts 210 in somewhat of an interleaving pattern such that the terminals 240 on either side of the bonding window (s) may be electrically connected to respective contacts 210. Other types of leads and lead bonding may be used, such the leads and bonding techniques described in commonly assigned U.S. Pat. No. 5,518,964 incorporated by reference herein.

Figure 12C:
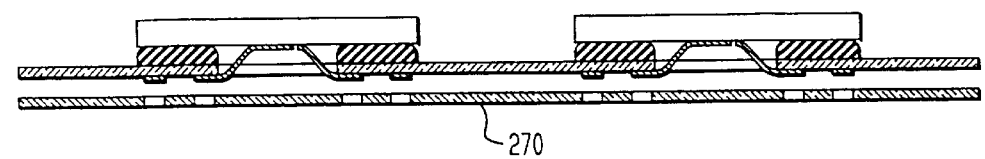
Figure 12D:
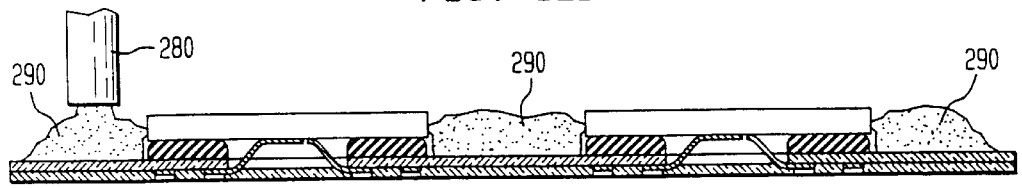
Figure 12E:
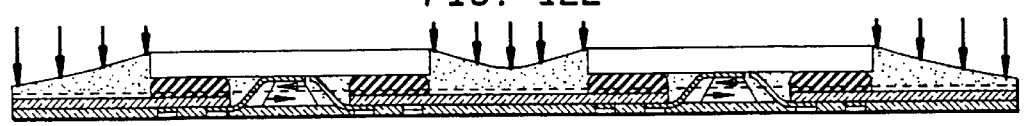
Figure 12F:
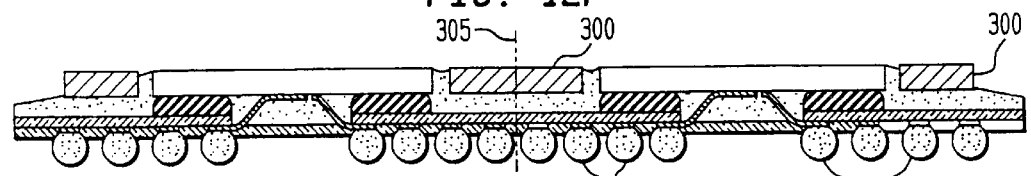
Figure 13A:
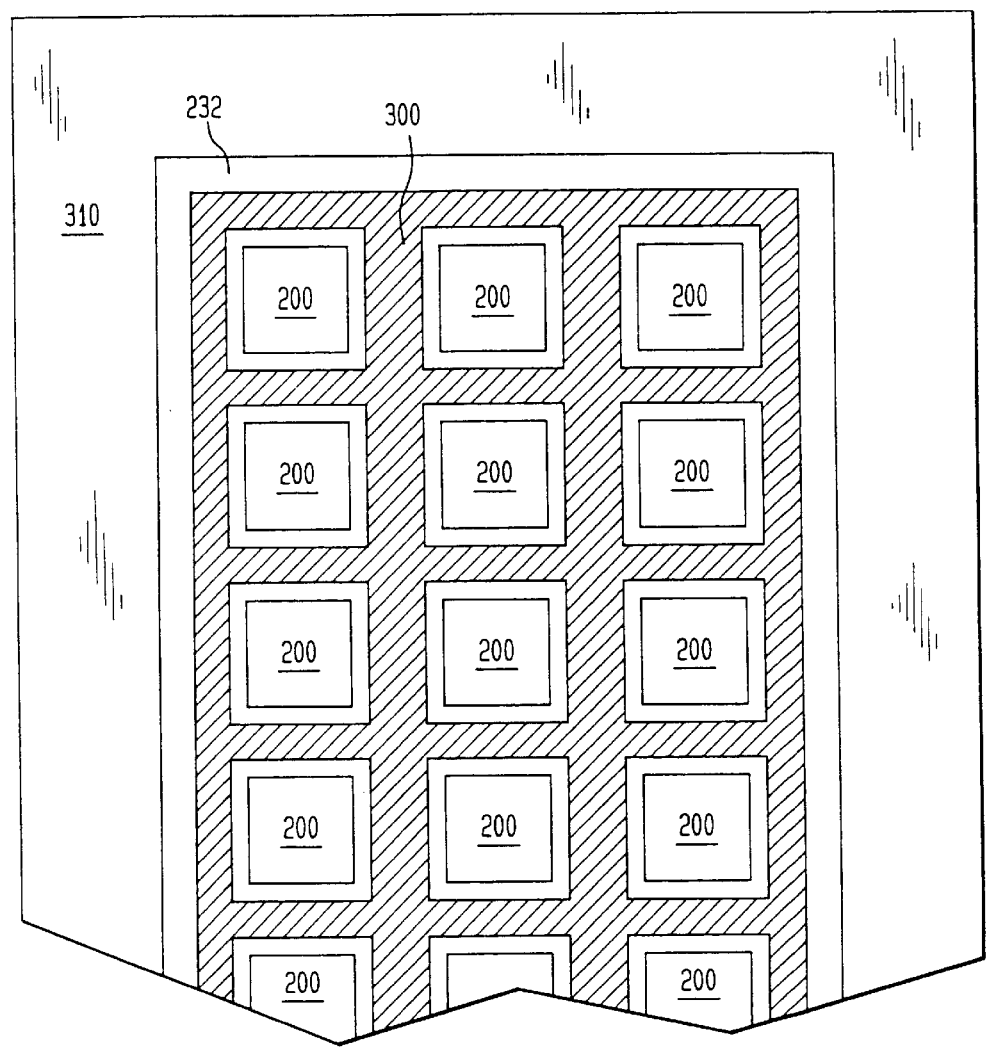
FIG. 13A shows a top plan view of a semiconductor chip assembly having a unitary support structure, according to the present invention.
Figure 13B:
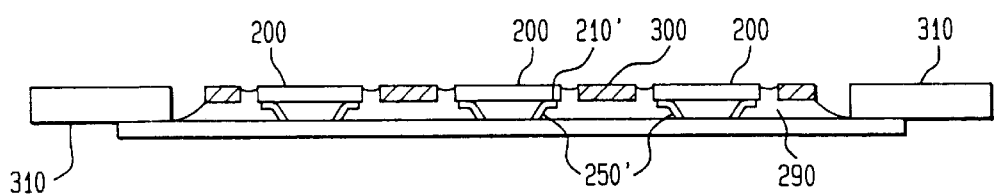
FIG. 13B is a cross-sectional side view of the semiconductor chip assembly in FIG. 13A.
Figure 15A:
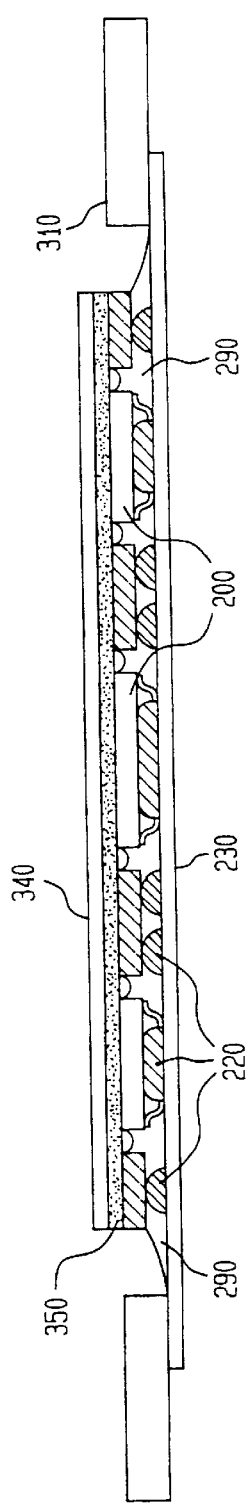
FIG. 15A shows a cross-sectional side view of another semiconductor chip assembly, according to the present invention.

As shown in FIG. 12C, a coverlay 270 is typically attached to the second surface 234 of the substrate 230 to seal the bonding window. There may also be one or more apertures in the coverlay 270 to expose the terminals 240 and allow for subsequent electrical connection thereto. In FIG. 12D, a dispensing needle 280 deposits a curable, liquid encapsulant 290 around the periphery of the chip 200. The amount or volume of the deposited encapsulant 290 need not be tightly regulated; however, preferably, the encapsulant 290 does not get on to the exposed back surface of the chip 200, so that the chip 200 may dissipate heat more easily when the packaged semiconductor chip is in operation, as described above. In FIGS. 12E and 12F, the encapsulant is allowed to wick between the complaint pads 220 and beneath the chip 200 to create a substantially uniform, void-free encapsulant layer. In FIG. 12F, after the encapsulant has been allowed to flow around the compliant layer and between the chip 200 and the substrate 230, a unitary support structure, such as the ring grid 300 having a plurality of apertures therein for receiving the chips 200 (as shown in FIGS. 13A and 13B), is attached to the exposed encapsulant 290 along side and around the chips 200 and preferably at least partially embedded therein. However, in other preferred embodiments, the unitary ring grid 300 is attached prior to depositing the encapsulant 290 and the encapsulant 290 is deposited after the ring grid 300 and is allowed to wick around and under the chip assembly or is pressurized to force the encapsulant under the chip assembly. In certain preferred embodiments, the compliant layer is comprised of a plurality of compliant pads which are attached or deposited on the first surface 232 of the substrate 230 beyond the periphery of the chip 200 such that the compliant pads are also located on a region of the tape where the ring grid 300 will be attached, such as shown in FIG. 15A. These additional compliant pads may be attached or deposited on the substrate 230 when the rest of the compliant layer 220 is attached or deposited thereon. Placing the compliant pads under the ring grid area will set a minimum height or standoff from the ring grid 300 to the substrate 230 and will help to maintain the ring grid in a plane parallel to the substrate (as shown in FIG. 3B).

Figure 12G:
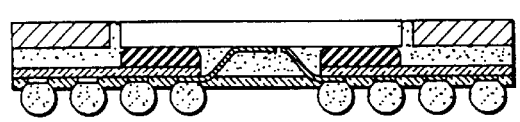

After the encapsulant 290 has underfilled the assembly structure, the encapsulant 290 is then typically fully cured. Solder balls 307 are next typically attached and reflowed on the terminals 240 so that the chips may be attached to supporting substrates, such as printed wiring boards. Processing all of the chip packages on a frame greatly reduces the time it takes to place the solder balls 307 on each of the packages. The cut-line 305 shows where the ring grid 300 and the rest of the package assembly will be next cut to separate the packaged chips (as shown in FIG. 12G) into individual chip packages or into multi-chip assemblies (not shown). Although not shown in the FIGURES, the ring grid 300 may be cut during the chip package singulation operation such that portions of the ring grid 300 are scrapped (not part of the finished chip package) so that the dimensional outline of the chip package may be reduced or increased by the singulation operation, i.e. by multiple cut or singulation lines. This way, the same ring grid 300 may be used in the packaging of similarly sized chips 200 where the chips may require more or less ring grid 300 width to support the terminals 240/solder balls 307 that reside outside the periphery of the chip 200.

Figure 13C:
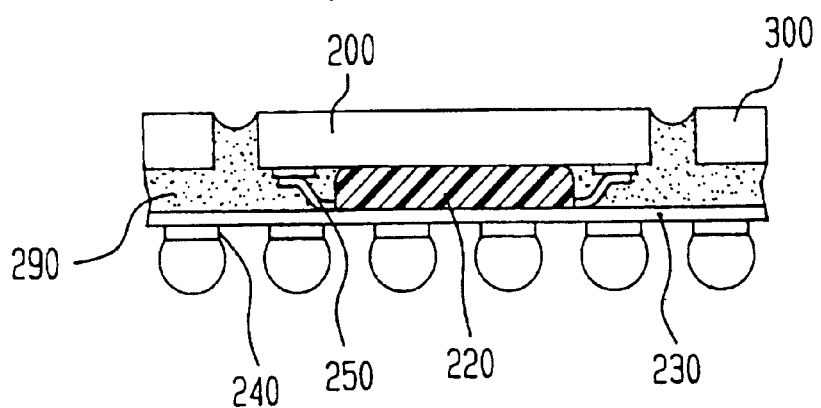
FIG. 13C is a cross-sectional side view of the resulting chip package assembly in FIG. 13A after singulation.

FIG. 13A shows a top plan view of an array of chips that are being packaged according to the process described in reference to FIGS. 12A–12F, except that three chips 200 are disposed in each row of chips 200 and attached to the first surface 232 of the substrate 230. The substrate is attached to and held somewhat taut by the frame 310, as described in the above embodiments. The unitary ring grid 300 has a plurality of apertures therein which may be aligned with respective chips 200 on the substrate 230 after the encapsulant (not shown) has been dispensed around the periphery of the chips 200. The ring grid 300 is attached to the encapsulant 290 and may also be at least partially embedded therein, as described above. FIG. 13B shows a side view of the total assembly, similar to the side view shown in FIG. 12F. The chips 200 in FIG. 13B can be seen to have contacts 210' in peripheral regions of the front surface 205 of the chip 200, as compared to the center contacts 210 shown in FIG. 12A and the compliant layer is comprised of a single unitary layer of complaint material. The leads 250' thus are also located on a different portion of the substrate 230 such that they align and may be connected to respective chip contacts 210'. FIG. 13C shows a chip package after it has been singulated from the frame 310.

The ring grid 300 may be comprised of virtually any type of rigid or semi-rigid material. It may be thermally conductive of insulative. Since the registration of the apertures to the chips 200 is not hyper-critical, the unitary ring grid may be made by a low cost stamping operation, etching operation or molding operation, among others. Examples of ring grid materials include copper alloys, stainless steel, paper phenalic, liquid crystal polymer, epoxy or other polymer based materials. Preferably, however, it is made from a material which is both low cost and rugged so that the resultant package can withstand standard surface mount handling operations without damage to the package. Further, the ring grid 300 and the frame 310 could be made as a single unitary piece which would allow for a single low cost stamping or molding operation to create the combination of these features.

Figure 14A:
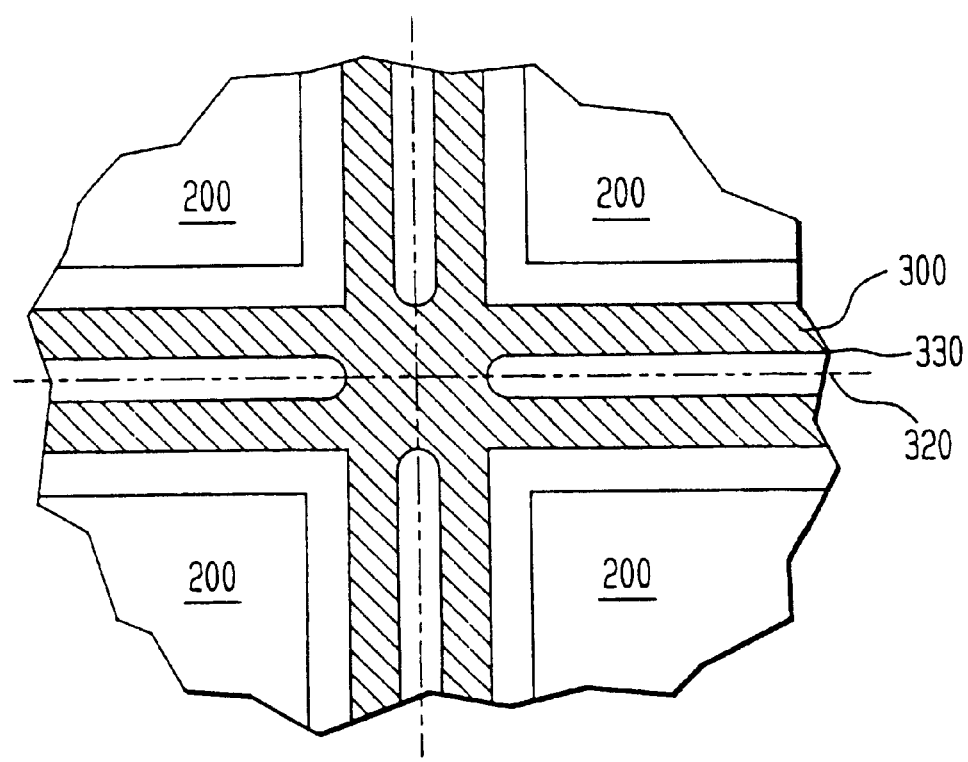
FIGS. 14A–14D is a fragmentary top plan view showing various unitary support structures, according to the present invention.
Figure 14B:
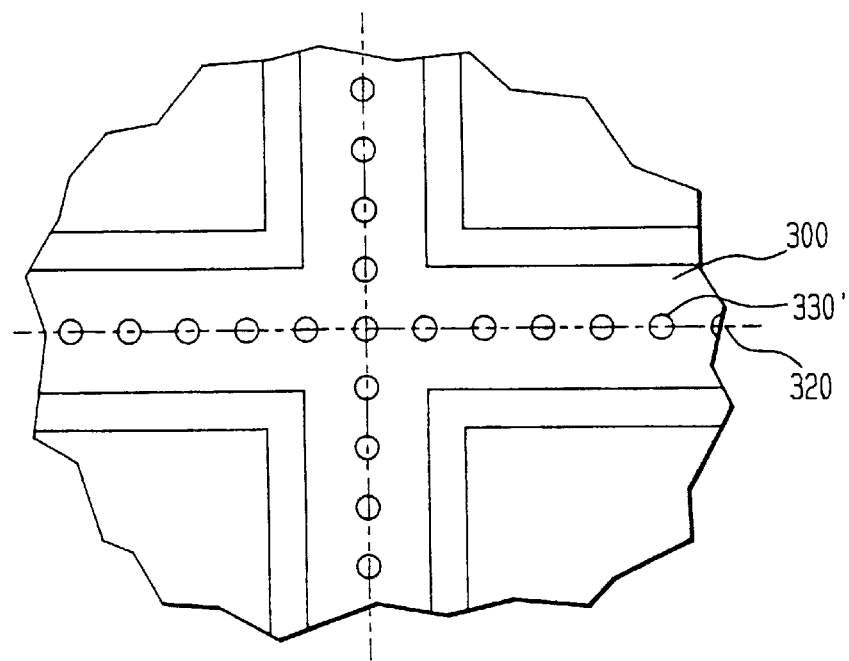
Figure 14C:
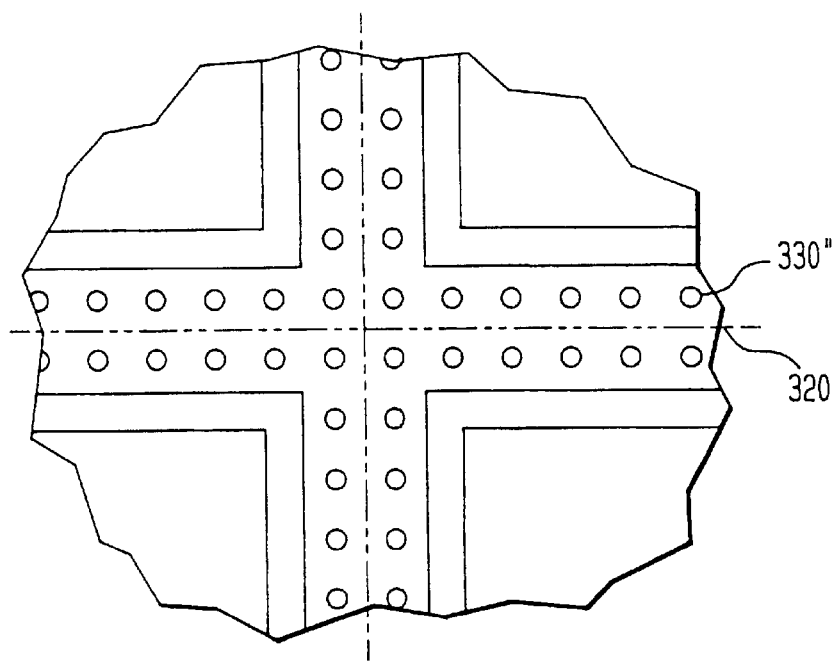
Figure 14D:
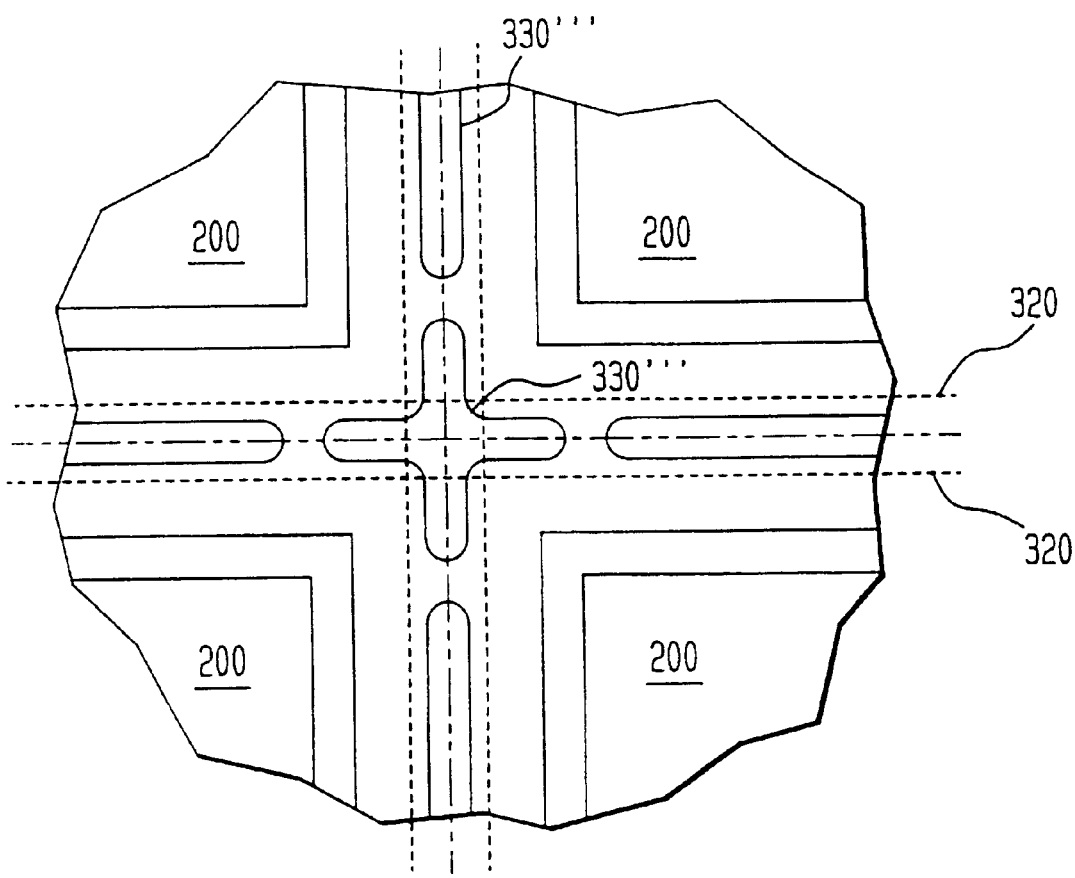

As shown in FIG. 14A, the ring grid may have elongated slots 330 extending through the ring grid which are centered along the eventual cut line 320 to allow the voids/gas bubbles to escape from underneath the ring grid 300. FIG. 14B shows a plurality of holes or apertures 330' along the cut line 320, instead of the elongated slots, in the ring grid 300 to allow for the voids to escape from the encapsulant 290. These slots are apertures in the ring grid 300 also perform the function of partially perforating the cut line 320 of the ring grid 300 to facilitate the singulation of the chip packages. However, since these slots/apertures are along the eventual cut line 320 of the package, they may give the top of the package a jagged look (like the edges of a U.S. postage stamp). FIG. 14C shows that the slots or apertures 330'' may also be off-set from the cut line 320 such that the voids/gas bubbles may escape from the encapsulant 290 under the ring grid 300 while still allowing the singulated package to have smooth periphery. FIG. 14D further shows that the slots/apertures 330''' may be centrally located while multiple cut lines 320 are offset from the slots 330''' such that the resulting chip package will have a smooth exterior. Other slot/aperture shapes and locations are also possible.

The unitary ring grid 300 may also be made of several independent ring grids each of which surround more than one chip. For example, if there are ten 8 mm square chips aligned and attached in two columns in a first region of the tape 230 and eight 10 mm by 6 mm rectangular chips aligned and attached in two columns to a second region of the tape 230, it may prove more useful and may be easier to align and attach two separate ring grids 300 on a single frame assembly. Depending on the length of the tape 230 on the frame 310 and the types of chips 200 attached thereto, three or more ring grids 300 may also be used.

As shown in FIG. 15A, another variation on the process and structures set forth above may include a sheet-like thermal spreader 340 attached to the exposed major surface of the ring grid 300 and the back surface of the chip 200, such as by using a thermally conductive epoxy or silicone die attach material, as shown in FIG. 15A (similar to the embodiment show in FIG. 11). In one embodiment, a thin layer of die attach 350 is used such that there may be voids between the thermal spreader 340 and the encapsulant 290. Preferably, however, the die attach 350 is thick enough to flow into the areas between each ring grid 300 and chip 200 combination such that the open areas or voids therebetween are reduced or eliminated. A pressure and heat treatment as described in U.S. patent application Ser. No. 08/610,610 (the disclosure of which is incorporated by reference herein) may also be used to get rid of any remaining voids between the thermal spreader and the ring grid/chip combination.

Figure 15B:
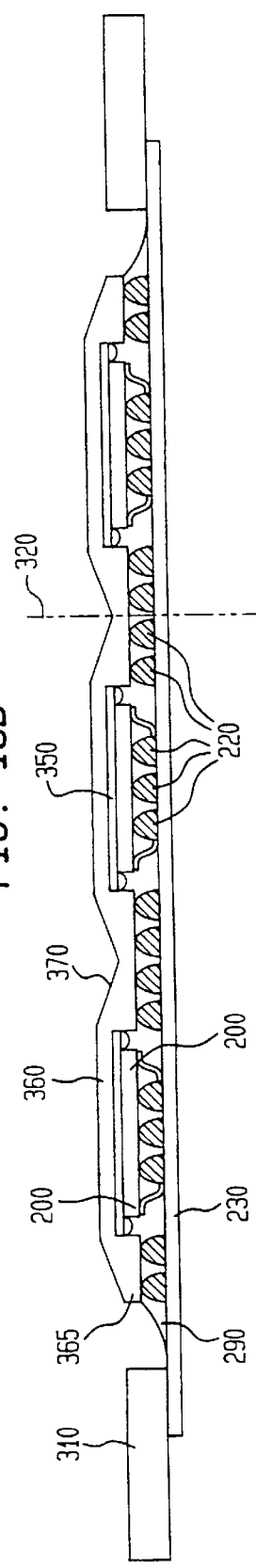
FIG. 15B shows a cross-sectional side view of another semiconductor chip assembly, according to the present invention.

FIG. 15B shows a further variant in which the ring grid 300 and thermal spreader 340 have been integrated into a unitary grid of package caps 360 which provide a rugged package exterior back surface and also has plural protruding support 365 on the sides of the chip 200 to perform the function of the ring grid to support the terminals 240 outside the periphery of the chip 200. As shown in FIG. 15B, the grid of caps 360 may include recessed areas 370 on the exposed exterior of the caps 360 above the protruding supports 365 to facilitate the singulation operation and to provide a more aesthetically pleasing package exterior. Further, the grid of caps 360 (and for that matter the sheet-like spreader 340 and/or the ring grid 300) may be made of an inexpensive material which is not a good thermal conductor, such as a plastic of other type of polymer thereby better allowing for the injection molding of the part prior to its attachment to the rest of the packages.

Typically, the aforementioned thermal spreader 340 (FIG. 15A) or cap 360 (FIG. 15B) would be attached to the ring grid 300 and the chips 200 after all other processing has been done but prior to the singulation step, such that when the packages are singulated each has a individual thermal spreader 340 or cap 360 that defines the size of the overall chip package.

Figure 16:
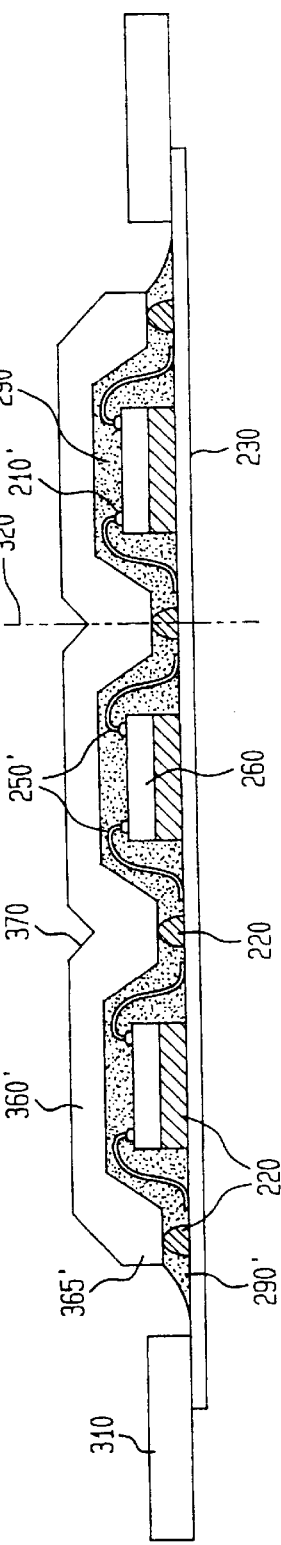
FIG. 16 shows a cross-sectional side view of another semiconductor chip assembly, according to the present invention.

The idea of a ring grid and/or combination with a thermal spreader or integration with a cap (a described above) may also be used where the chip 200 is oriented such that its contacts 210' and the face surface 205 of the chips 200 are oriented away from the substrate 230. FIG. 16 shows an embodiment where each of the chips 200 have been attached to the substrate 230 by the compliant layer 220 and the chip contacts 210' are electrically connected to the leads and terminals on the substrate 230 through the use of conventional wire bonds 250'. Next, an encapsulant 290' is deposited around the individual chip assemblies such that the wire bonds 250' are fully covered by the encapsulant 290'. The encapsulant 290 in this embodiment could be compliant, such as a silicone, or it could be more of a rigid encapsulant, such as an epoxy or the like. Typically, the encapsulant 290 is loaded with particulate material to make the encapsulant more thermally conductive.

A grid of caps 360' is next placed over the encapsulant 290, as shown, before the encapsulant 290' is fully cured to allow the encapsulant 290' to wet or adhere to the cap 360'. Complaint pads 220 may be deposited or attached such that they help to planarize the grid of caps 360' with respect to the tape/frame assembly and further set the minimum height from the tape to the protruding supports 365'. Typically the cavities in the cap will need to be deeper that the corresponding cavities shown in FIG. 15B because of the upwardly protruding wire bonds 250'. The grid of caps 360' may also have apertures or slots extending therethrough to help to vent any entrapped voids or bubbles at the junction of the encapsulant 290' and the caps 360'. Also, a pressure and heat treatment as described in U.S. patent application Ser. No. 08/610,610 may be used to minimize such voids and/or bubbles.

Further, the grid of caps 360' may be comprised of a material which has a coefficient of thermal expansion similar to that of the chip 200 so as to constrain the movement of the wire bonds 250' thereby relieving mechanical stress and strain forces thereto, as described in more detail in U.S. patent application Ser. No. 08/962,988 hereby incorporated by reference herein. The idea here is to "tune" the coefficient of expansion of the caps 360' so that if the caps 360' and chip 200 have similar coefficients of thermal expansion, both will tend to expand and contract by approximately the same amounts during temperature changes. Thus, the movement of the portion of the encapsulant 290 that surrounds the wire bonds 250' and the wire bonds 250' themselves are constrained between the spreader and the chip 200. The encapsulant in this region thus tends to move with the chip 200 and the caps 360'. Therefore, there is a reduction in shear strain in the encapsulant 290. Accordingly, the relatively delicate wire bonds 250' are effectively protected from flexure during thermal cycling. Desirably, the linear coefficient of thermal expansion of the caps 360' is between about 50% and about 200% of the linear coefficient of thermal expansion of the chip. For a conventional silicon chip having a linear coefficient of thermal expansion of about $3 \times 10^{-6}$ cm/cm-° C., the linear coefficient of thermal expansion of the caps 360' therefore is desirably is between 1.5 and about $6 \times 10^{-6}$ cm/cm-° C. Examples of cap 360' materials which may be used in this way are Invar, Copper/Invar, Alloy 42, Tungsten/Copper. Also, the encapsulant 290 can be loaded with particulate material in order to bring its coefficient of thermal expansion closer to that of the chips 200 in order to give better stress relief for the wire bonds 250'.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A semiconductor chip packaging assembly, comprising:
 a frame having a central aperture;
 a flexible substrate attached to the frame across the central aperture of the frame, the substrate having terminals thereon;
 a unitary support structure having a plurality of apertures therethrough attached to the substrate within the central aperture of the frame, at least some of the substrate terminals underlying the unitary support structure;
 a chip disposed at least partially within each aperture in the unitary support and attached to the substrate, the chip further including a plurality of electrical contacts on a surface thereof, wherein the contacts are electrically connected to the substrate terminals; and
 a compliant layer disposed between the substrate and the unitary support structure and between the substrate and the chip.

2. The packaging assembly as claimed in claim 1, wherein the unitary support structure includes a plurality of separate unitary support structures each surrounding a plurality of chips and being attached to the substrate.

3. The packaging assembly as claimed in claim 1, further including a plurality of compliant pads disposed between the substrate and the unitary support structure whereby the compliant pads set the height between the unitary support structure and the substrate.

4. The packaging assembly as claimed in claim 3, further including a thermally conductive, sheet-like spreader attached to the unitary support structure and a surface of the chip.

5. The packaging assembly as claimed in claim 1, wherein the unitary support structure further includes an integral cap covering one opening of each aperture.

6. The packaging assembly as claimed in claim 5, wherein the caps are attached to the chips disposed in the respective apertures.

7. The packaging assembly as claimed in claim 5, wherein the unitary support structure and cap are thermally conductive.

8. The packaging assembly as claimed in claim 1, wherein the compliant layer is comprised of a plurality of compliant pads and a cured, compliant encapsulant disposed between such pads.

9. The packaging assembly as claimed in claim 1, wherein the chip is oriented so that the chip contacts face away from the substrate.

10. The packaging assembly as claimed in claim 1, further comprising encapsulant covering at least a portion of the unitary support structure.

* * * * *

UNITED STATES PATENT AND TRADEMARK OFFICE
CERTIFICATE OF CORRECTION

PATENT NO.     : 6,359,335
DATED          : March 19, 2002
INVENTOR(S)    : Thomas H. DiStefano, John W. Smith and Craig S. Mitchell It is certified that error appears in the above-identified patent and that said Letters Patent is hereby corrected as shown below:

<u>Title page,</u>
Inventors, "Distefano" should read -- DiStefano --

<u>Column 9,</u>
Line 31, after "mold" insert -- such --.

Signed and Sealed this

Twenty-eighth Day of May, 2002

*Attest:*

*Attesting Officer*

JAMES E. ROGAN
*Director of the United States Patent and Trademark Office*